(12) United States Patent
Kaplan et al.

(10) Patent No.: US 9,184,412 B2
(45) Date of Patent: Nov. 10, 2015

(54) ORGANIC LIGHT-EMITTING DISPLAY APPARATUS AND RELATED MANUFACTURING METHOD

(71) Applicant: Samsung Display Co., Ltd., Yongin, Gyeonggi-Do (KR)

(72) Inventors: Leonid Kaplan, Yongin (KR); Min-Soo Kim, Yongin (KR); Jin-Woo Park, Yongin (KR); Won-Sik Hyun, Yongin (KR); Ou-Hyen Kim, Yongin (KR); Il-Sang Lee, Yongin (KR); Sang-Wook Shin, Yongin (KR); Sun-Young Jung, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/147,276

(22) Filed: Jan. 3, 2014

(65) Prior Publication Data
US 2015/0014646 A1    Jan. 15, 2015

(30) Foreign Application Priority Data
Jul. 12, 2013    (KR) .................. 10-2013-0082437

(51) Int. Cl.
*H01L 21/56* (2006.01)
*H01L 51/52* (2006.01)
*H01L 51/56* (2006.01)

(52) U.S. Cl.
CPC ............ *H01L 51/5253* (2013.01); *H01L 51/56* (2013.01)

(58) Field of Classification Search
CPC .................... H01L 51/56; H01L 51/5253

USPC ............................................ 257/40
See application file for complete search history.

(56) References Cited

U.S. PATENT DOCUMENTS

| 7,722,929 | B2 | 5/2010 | Aitken et al. |
| 2007/0040501 | A1 | 2/2007 | Aitken et al. |
| 2007/0252526 | A1 | 11/2007 | Aitken et al. |

(Continued)

FOREIGN PATENT DOCUMENTS

KR    10-2008-0045217    5/2008

OTHER PUBLICATIONS

Burrows et al., "Reliability and degradation of organic light emitting devices." Applied Physics Letters, vol. 65, No. 23, Dec. 5, 1994, pp. 2922-2924.

(Continued)

*Primary Examiner* — Tran Tran
(74) *Attorney, Agent, or Firm* — Innovation Counsel LLP

(57) ABSTRACT

An organic light emitting display apparatus includes a substrate and includes an organic light emitting device that overlaps the substrate and includes an organic layer. The organic light emitting display apparatus further includes a planarization layer that overlaps the organic light emitting device and includes an organic material, wherein the organic light emitting device is disposed between the substrate and the planarization layer. The organic light emitting display apparatus further includes an encapsulation layer that overlaps the planarization layer and includes an inorganic material, wherein the planarization layer is disposed between the organic light emitting device and a portion of the encapsulation layer. The organic light emitting display apparatus further includes an intermediate layer that is disposed between the planarization layer and the portion of the encapsulation layer.

18 Claims, 5 Drawing Sheets

(56) References Cited

U.S. PATENT DOCUMENTS

2008/0206589 A1    8/2008   Aitken et al.
2010/0065882 A1*   3/2010   Matsumoto et al. ............ 257/99
2010/0134426 A1*   6/2010   Lee et al. ...................... 345/173

OTHER PUBLICATIONS

Chatham, Hood, "Oxygen diffusion barrier properties of transparent oxide coatings on polymeric substrates." Surface and Coatings Technology 78, 1996, pp. 1-9.

Kolosov et al., "Direct observation of structural changes in organic light emitting devices during degradation." Journal of Applied Physics, vol. 90, No. 7, Oct. 1, 2001, pp. 3242-3247.

Forsythe, Eric W., "Operation of Organic-Based Light-Emitting Devices." Society for Information Display seminar notes, 2002.

Aziz et al., "Degradation Mechanism of Small Molecule-Based Organic Light-Emitting Devices." Science, vol. 283, Mar. 19, 1999, pp. 1900-1902.

Li Ew et al., "Investigation of the sites of dark spots in organic light-emitting devices." Applied Physics Letters, vol. 77, No. 17, Oct. 23, 2000, pp. 2650-2652.

* cited by examiner

ORGANIC LIGHT-EMITTING DISPLAY APPARATUS AND RELATED MANUFACTURING METHOD

CROSS-REFERENCE TO RELATED PATENT APPLICATION

This application claims the benefit of Korean Patent Application No. 10-2013-0082437, filed on Jul. 12, 2013, in the Korean Intellectual Property Office, the disclosure of which is incorporated herein in its entirety by reference.

BACKGROUND OF THE INVENTION

1. Field of the Invention

The present invention relates to an organic light emitting display apparatus and a method for manufacturing the organic light emitting display apparatus.

2. Description of the Related Art

An organic light emitting display apparatus typically includes an organic light emitting device that includes a first electrode, a second electrode, and at least one organic emission layer disposed between the first and second electrodes. The organic light emitting display apparatus may further include an encapsulation structure for protecting the organic light emitting device from moisture and/or heat.

SUMMARY OF THE INVENTION

Embodiments of the present invention may be related to a display apparatus that has substantially satisfactory encapsulation characteristics and durability and may be related to a method for manufacturing the display apparatus.

An embodiment of the present invention may be related to an organic light emitting display apparatus that may include a substrate and may include an organic light emitting device that overlaps the substrate and includes an organic layer. The organic light emitting display apparatus may further include a planarization layer that overlaps the organic light emitting device and includes an organic material, wherein the organic light emitting device may be disposed between the substrate and the planarization layer. The organic light emitting display apparatus may further include an encapsulation layer that overlaps the planarization layer and includes an inorganic material, wherein the planarization layer may be disposed between the organic light emitting device and a portion of the encapsulation layer. The organic light emitting display apparatus may further include an intermediate layer that is disposed between the planarization layer and the portion of the encapsulation layer.

A thermal expansion coefficient of the intermediate layer may be between a thermal expansion coefficient of the encapsulation layer and a thermal expansion coefficient of the planarization layer. The thermal expansion coefficient of the intermediate layer may be greater than or equal to ten times the thermal expansion coefficient of the encapsulation layer and/or may be less than or equal to thirty times the thermal expansion coefficient of the encapsulation layer. The thermal expansion coefficient of the intermediate layer may be lower than thirty times the thermal expansion coefficient of the encapsulation layer and/or may be lower than the thermal expansion coefficient of the planarization layer.

The intermediate layer may include an amorphous material or a crystalline material that has a viscosity that is lower than a viscosity of the organic material of the planarization layer.

The intermediate layer may include an amorphous material or a crystalline material that has a glass transition temperature that is higher than a glass transition temperature of the inorganic material of the encapsulation layer.

A melting point of a material of the intermediate layer may be lower than a melting point of the organic material of the planarization layer.

The intermediate layer may include an amorphous material or a crystalline material that has a melting temperature that is lower than a liquidus temperature of the inorganic material of the encapsulation layer.

The intermediate layer may include an elastic material with a modulus of elasticity lower than 2.5 GPa.

The intermediate layer may include an amorphous material that has a glass transition temperature that is lower than a solidus temperature of the inorganic material of the encapsulation layer and is higher than a working temperature of the organic light emitting display apparatus.

The intermediate layer may comprise at least one of chromium, cobalt, an aluminum oxide, gadolinium, germanium, iridium, molybdenum, nickel, niobium, platinum, titanium, vanadium, and zirconium.

The intermediate layer may include an acrylic material member and a fiber member that overlap each other. The fiber member may include a multidirectional fiber formed of a low temperature viscosity transition (LVT) inorganic material.

The intermediate layer may include a low temperature viscosity transition (LVT) inorganic material and may be thinner than the portion of the encapsulation layer.

The intermediate layer may include an adhesive material.

The inorganic material of the encapsulation layer may be a low temperature viscosity transition (LVT) inorganic material.

A minimum temperature at which the inorganic material starts to have flowability may be lower than a denaturation temperature of one or more materials included in the organic layer of the organic light emitting device.

The inorganic material of the encapsulation layer may include at least one of a tin oxide, a phosphor oxide, a boron phosphate, a tin fluoride, a niobium oxide, and a tungsten oxide.

The inorganic material of the encapsulation layer may include SnO; SnO and $P_2O_5$; SnO and $BPO_4$; SnO, $SnF_2$, and $P_2O_5$; SnO, $SnF_2$, $P_2O_5$, and NbO; or SnO, $SnF_2$, $P_2O_5$, and $WO_3$.

An embodiment of the present invention may be related to a method for manufacturing an organic light emitting display apparatus. The method may include the following steps: forming an organic light emitting device on a substrate, wherein the organic light emitting device includes an organic layer; forming a planarization layer on the organic light emitting device, wherein the planarization layer includes an organic material; forming an intermediate layer on the planarization layer; and forming an encapsulation layer on the intermediate layer, wherein the encapsulation layer includes an inorganic material, and wherein a thermal expansion coefficient of the intermediate layer is between a thermal expansion coefficient of the encapsulation layer and a thermal expansion coefficient of the planarization layer.

The step of forming the encapsulation layer may include the following steps: forming a preliminary thin film encapsulation layer on the intermediate layer; heating the preliminary thin film encapsulation layer at a temperature higher than or equal to a viscosity transition temperature of the inorganic material; and after the heating, cooling the preliminary thin film encapsulation layer to a temperature lower than a denaturation temperature of a material of the organic layer of the organic light emitting device.

An embodiment of the present invention may be related to an organic light emitting display apparatus that includes the following elements: a substrate; an organic light emitting device that is formed on the substrate and includes a first electrode, a second electrode, and an organic layer including at least an organic emission layer; a planarization layer that is formed on the organic light emitting device and includes an organic material; a thin film encapsulation layer that is formed on the planarization layer and includes at least one inorganic layer including a low temperature viscosity transition (LVT) inorganic material; and an intermediate layer that is disposed between the planarization layer and the thin film encapsulation layer.

The intermediate layer may have a coefficient of thermal expansion that is between coefficients of thermal expansion of the thin film encapsulation layer and the planarization layer.

The intermediate layer may include an amorphous material or a crystalline material that has a low viscosity or non-sticking properties.

The amorphous material and the crystalline material may have a glass transition temperature that is higher than a glass transition temperature of the LVT inorganic material of the thin film encapsulation layer.

The intermediate layer may include a low-melting point material.

The low-melting point material may include an amorphous material or a crystalline material that has a lower melting temperature than a liquidus temperature of the LVT inorganic material of the thin film encapsulation layer.

The intermediate layer may include a rubber-like material.

The rubber-like material may include an amorphous material that has a glass transition temperature that is lower than a solidus temperature of the LVT inorganic material of the thin film encapsulation layer and is higher than a working temperature of the organic light emitting display apparatus.

The intermediate layer may include a material having a low coefficient of thermal expansion.

The material having a low coefficient of thermal expansion may include chromium, cobalt, an aluminum oxide, gadolinium, germanium, iridium, molybdenum, nickel, niobium, platinum, titanium, vanadium, or zirconium.

The intermediate layer may have a mixed structure that includes an acrylic material member and a fiber member.

The fiber member may include an LVT inorganic material and may be formed omnidirectionally.

The intermediate layer may include a glass material containing an LVT inorganic material. The intermediate layer may be thinner than the thin film encapsulation layer.

The intermediate layer may include an adhesive material.

A viscosity transition temperature of the LVT inorganic material may be a minimum temperature at which the LVT inorganic material starts to have flowability.

A viscosity transition temperature of the LVT inorganic material may be lower than a denaturation temperature of one or more materials included in the organic layer of the organic light emitting device.

The LVT inorganic material may include a tin oxide.

The LVT inorganic material may include at least one of a phosphor oxide, a boron phosphate, a tin fluoride, a niobium oxide, and a tungsten oxide.

The LVT inorganic material may include SnO; SnO and $P_2O_5$; SnO and $BPO_4$; SnO, $SnF_2$, and $P_2O_5$; SnO, $SnF_2$, $P_2O_5$, and NbO; or SnO, $SnF_2$, $P_2O_5$, and $WO_3$.

An embodiment of the present invention may be related to a method for manufacturing an organic light emitting display apparatus. The method may include the following steps: forming an organic light emitting device, which includes a first electrode, a second electrode, and an organic layer including at least an organic emission layer, on a substrate; forming a planarization layer, which includes an organic material, on the organic light emitting device; forming an intermediate layer on the planarization layer; and forming a thin film encapsulation layer, which includes at least one inorganic layer that includes a low temperature viscosity transition (LVT) inorganic material, on the intermediate layer.

DETAILED DESCRIPTION OF THE INVENTION

Figure 1:
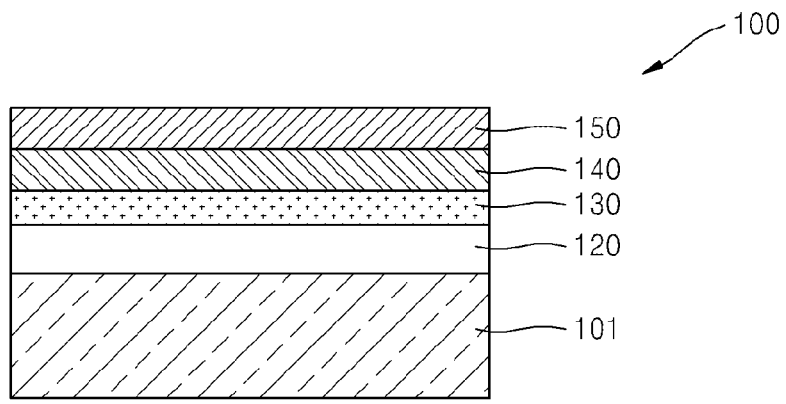
FIG. 1 is a schematic cross-sectional view illustrating an organic light emitting display apparatus according to an embodiment of the present invention.

The invention may be embodied in many different forms and should not be construed as being limited to the embodiments set forth herein.

In the drawings, dimensions (e.g., sizes and/or thicknesses) of constituent elements are for convenience of illustration, and the present invention is not necessarily limited to the drawings.

In the description, when an element (such as a layer, film, region, or substrate) is referred to as being "on" another element, it can be directly on the other element, or an intervening element may also be present. When an element is referred to as being "on" another element, it can be placed on or below the other element, and it may not necessarily mean that the element is on the other element in a direction of gravity.

The terms "comprises," "comprising," "includes," and/or "including" may specify the presence of components, but do not preclude the presence or addition of one or more other components, unless otherwise specified.

Although the terms "first," "second," etc. may be used herein to describe various signals, elements, components, regions, layers, and/or sections, these signals, elements, components, regions, layers, and/or sections should not be limited by these terms. These terms may be used to distinguish one signal, element, component, region, layer, or section from another signal, region, layer, or section. Thus, a first signal, element, component, region, layer, or section discussed below may be termed a second signal, element, component, region, layer, or section without departing from the teachings of the present invention. The description of an element as a "first" element may not require or imply the presence of a second element or other elements. The terms "first," "second," etc. may also be used herein to differentiate different categories of elements. For conciseness, the terms "first," "second," etc. may represent "first-type (or first-category)," "second-type (or second-category)," etc., respectively.

The term "and/or" may include any and all combinations of one or more of the associated items. Expressions such as "at least one of," when preceding a list of elements, may modify the entire list of elements and may not modify the individual elements of the list.

Figure 2:
FIG. 2 is a schematic cross-sectional view illustrating an organic light emitting device of the organic light emitting display apparatus illustrated in FIG. 1 according to an embodiment of the present invention.

FIG. 1 is a schematic cross-sectional view illustrating an organic light emitting display apparatus 100 according to an embodiment of the present invention. FIG. 2 is a cross-sectional view illustrating an organic light emitting device 120 of the organic light emitting display apparatus 100 according to an embodiment of the present invention.

Referring to FIGS. 1 and 2, the organic light emitting display apparatus 100 includes a substrate 101, the organic light emitting device 120, a planarization layer 130, an intermediate layer 140, and a thin film encapsulation layer 150. The thin film encapsulation layer 150 may include at least one inorganic layer that includes a low-temperature viscosity transition (LVT) inorganic material.

The substrate 101 may be formed of a transparent glass material that includes $SiO_2$. Alternatively or additionally, the substrate 101 may be formed of a transparent plastic material.

The organic light emitting device 120 may be formed on the substrate 101. The organic light emitting device may include a first electrode 121, a second electrode 122, and an organic layer 123. The first electrode 121 may be disposed on the substrate 101, the second electrode 122 may overlap the first electrode 121, and the organic layer 123 may be disposed between the first electrode 121 and the second electrode 122.

Although not shown in the drawings, a buffer layer (not shown) may be disposed between the first electrode 121 and the substrate 101. The buffer layer (not shown) may provide a planarized surface on the substrate 101 and/or may prevent penetration of moisture or gas from substantially affecting the first electrode 121.

The first electrode 121 may function as an anode or a cathode, and the second electrode 122 may function as a cathode or an anode.

In an embodiment, the first electrode 121 functions as an anode. The first electrode 121 may include a material having a high work function. For example, the first electrode may be formed of a material that includes at least one of ITO, IZO, ZnO, $In_2O_3$, etc. The first electrode may additionally include a reflection layer formed of a material that includes at least one of Ag, Mg, Al, Pt, Pd, Au, Ni, Nd, Ir, Cr, Li, Yb, Ca, etc.

In an embodiment the second electrode 122 functions as a cathode. The second electrode 122 may be formed of a metal material that includes at least one of Ag, Mg, Al, Pt, Pd, Au, Ni, Nd, Ir, Cr, Li, Ca, etc. The second electrode 122 may be formed of a material that includes at least one of ITO, IZO, ZnO, $In_2O_3$, etc., for light transmission.

The organic layer 123 may include an organic emission layer. The organic layer 123 may further include at least one of a hole injection layer, a hole transport layer, an electron transport layer, and an electron injection layer.

When a voltage is applied to at least one of the first electrode 121 and the second electrode 122, visible light may be generated in the organic emission layer of the organic layer 123.

Although not shown in the drawings, the organic light emitting display apparatus 100 may include at least one thin film transistor (not shown) that is electrically connected to the organic light emitting device 120.

The planarization layer 130 is formed on the organic light emitting device 120 to provide a substantially planar surface on the organic light emitting device 120 and/or to protect the organic light emitting device 120. The planarization layer 130 may be formed of at least one of various insulating materials. The planarization layer 130 may be formed of an organic material that has a desirable planarizing characteristic. In an embodiment, the planarization layer 130 may include an acrylic polymer material, in order to provide satisfactory thermal insulation and/or satisfactory planarization.

The intermediate layer 140 is formed on the planarization layer 130. A coefficient of thermal expansion (CTE) of the intermediate layer 140 is between a CTE of the planarization layer 130 and a CTE of the thin film encapsulation layer 150. The CTE of the planarization layer 130 and the CTE of the thin film encapsulation layer 150 may be substantially different from each other. For example, a CTE of an organic material (e.g., an acrylic polymer material) of the planarization layer 130 may be in a range of about ten to thirty times a CTE of the thin film encapsulation layer 150. According to an embodiment of the present invention, the intermediate layer 140 interposed between the thin film encapsulation layer 150 and the planarization layer 130 may substantially prevent potential cracks in the thin film encapsulation layer 150 that might be caused by stress associated with the substantial CTE difference.

The intermediate layer 140 may be formed of one or more of various materials. A CTE of the intermediate layer 140 may have a value between a CTE of the planarization layer 130 and a CTE of the thin film encapsulation layer 150.

According to an embodiment of the present invention, the intermediate layer 140 may include a low-viscosity and/or non-sticking material. The intermediate layer 140 may have a relatively low viscosity and/or may be non-viscous with respect to a liquid material used for forming the thin film encapsulation layer 150.

The low-viscosity and/or non-viscous material may include an amorphous material and may particularly have a glass transition temperature that is higher than a glass transition temperature Tg of a low temperature viscosity transition (LVT) inorganic material of the thin film encapsulation layer 150. The amorphous material, which may have a low viscosity and/or may be non-viscous, may include a polymer material, silicate, or a combination of these materials. The polymer material may include at least one of polyimide, polyamide, Teflon, homopolymer, and copolymer. The copolymer may include at least one of 2H-benzimidazol-2-one, acenaphthylene, acrylamide, bisphenol A terephthalate, bisphenol carbonate, bisphenol Z carbonate, 2,6-Dichlorostyrene, 2,6-Dimethyl-1,4-phenylene oxide, 2,5-Dimethylstyrene, methacrylic acid, methacrylic anhydride, oxy-4,4'-biphenyleneoxy-1,4-phenylenesulfonyl-1,4-phenylene, oxy-1,4-phenylenesulfonyl-1,4-phenyleneoxy-1,4-phenyleneisopropylidene-1,4-phen ylene, oxy-1,4-phenylenesulfonyl-1,4-phenylene ether, p-Phenylene isophthalamide, p-Phenylene terephthalamide, Potassium acrylate, Sodium acrylate, Sodium methacrylate, Tetrabromobisphenol A carbonate, 2,4,6-Trimethylstyrene, Vinyl acetate, Vinyl butyral, Vinyl carbazole, Vinylferrocene, 2-Vinylnaphthalene, and 4-Vinylpyridine.

The intermediate layer 140, which may include an amorphous material, may be formed using one or more of various methods, such as one or more of a sputtering method, a co-evaporation method, a spray method, a pouring method, a painting method, a rolling method, and a spin-coating method.

The low-viscosity and/or non-sticking material for forming the intermediate layer 140 may include a crystalline material. The crystalline material may also be a polycrystalline. The crystalline material may have a glass transition temperature that is higher than a glass transition temperature Tg of an LVT inorganic material of the thin film encapsulation layer 150. The intermediate layer 140, which may include a crystalline material, may be formed using one or more of various methods, such as one or more of a sputtering method, a co-evaporation method, a spray method, a pouring method, a painting method, a rolling method, and a spin-coating method.

Since the glass transition temperature of the low-viscosity and/or non-sticking material of the intermediate layer 140 is higher than the glass transition temperature Tg of the LVT inorganic material of the thin film encapsulation layer 150, the intermediate layer 140 maintains a solid state when the thin film encapsulation layer 150 is formed, so that a liquid material for forming the encapsulation layer 150 does not substantially react with or combine with the intermediate layer 140 when the thin film encapsulation layer 150 is formed. Accordingly, desirable structures and/or characteristics of the thin film encapsulation layer 150 and/or the intermediate layer 140 may be provided. The intermediate layer 140 may effectively prevent or minimize potential stress and/or cracks that may be generated due to a substantial difference between the CTE of the planarization layer 130 and the CTE of the thin film encapsulation layer 150.

According to an embodiment, the intermediate layer 140 may include a low-melting point material. The low-melting point material may have a low miscibility to and/or may not substantially mix with an LVT inorganic material in a liquid state when the thin film encapsulation layer 150 is formed.

The low-melting point material may include an amorphous material. The amorphous material may have a melting temperature that is lower than a liquidus temperature of an LVT inorganic material of the thin film encapsulation layer 150. The melting temperature of the amorphous material may be higher than a working temperature of the organic light emitting display apparatus 100. The amorphous material may be a polymer material. For example, the polymer material may include at least one of cis-chlorobutadiene, ethylene oxide, ethyl vinyl ether, trans-isoprene, propylene oxide, propyl vinyl ether, and vinyl acetal.

The intermediate layer 140, which may include a low-melting point material (e.g., an amorphous material), may be formed using one or more of various methods, such as one or more of a sputtering method, a co-evaporation method, a spray method, a pouring method, a painting method, a rolling method, and a spin-coating method.

The low-melting point material of the intermediate layer 140 may include a crystalline material. The crystalline material may have a melting temperature that is lower than a liquidus temperature of an LVT inorganic material of the thin film encapsulation layer 150 and is higher than a working temperature of the organic light emitting display apparatus 100. The crystalline material may include an alloy material, such as Field's metal (Bi 32.5%, In 51.0%, Sn 16.5%), Lipowitz's alloy (Bi 49.5%, Pb 27.3%, Sn 13.1%, Cd 10.1%), Wood's metal (Bi 50.0%, Pb 25.0%, Sn 12.5%, Cd 12.5%), In—Bi alloy (In 66.3%, Bi 33.7%), or Onion's Fusible Alloy (Bi 50%, Pb 30%, Sn 20% and impurities).

The intermediate layer 140, which may include a crystalline material, may be formed using, for example, one or more of a sputtering method, a co-evaporation method, a laser ablation method, a flash deposition method, a spray method, a pouring method, a frit-deposition method, a vapor deposition method, a dip-coating method, a painting method, a rolling method, and a spin-coating method.

The intermediate layer 140 may be in a liquid state in a process of forming the thin film encapsulation layer 150 and may not substantially react with an LVT inorganic material of the thin film encapsulation layer 150. Consequently, desirable structures and/or characteristics of the thin film encapsulation layer 150 and/or the intermediate layer 140 may be provided. The intermediate layer 140 may effectively prevent and/or minimize potential stress and/or cracks in the thin film encapsulation layer 150 that may be generated due to a substantial difference between the CTE of the planarization layer 130 and the CTE of the thin film encapsulation layer 150.

According to an embodiment, the intermediate layer 140 may include a rubber-like material (or elastic material) with a modulus of elasticity (i.e., Young's Modulus) lower than or equal to 2.5 GPa. The rubber-like material may not substantially react and/or combine with an LVT inorganic material of the thin film encapsulation layer 150 while or after the thin film encapsulation layer 150 is formed. Accordingly, desirable structures and/or characteristics of the thin film encapsulation layer 150 and/or the intermediate layer 140 may be provided. The intermediate layer 140 may effectively prevent and/or minimize potential stress and/or cracks in the thin film encapsulation layer 150 that may be generated due to a substantial difference between the CTE of the planarization layer 130 and the CTE of the thin film encapsulation layer 150.

The rubber-like material of the intermediate layer 140 may have a low miscibility to and/or may not substantially mix with an LVT inorganic material in a liquid state when the thin film encapsulation layer 150 is formed. The rubber-like material of the intermediate layer 140 may have a low wettability with respect to an LVT inorganic material and/or may not be substantially wetted by an LVT inorganic material in a liquid state when the thin film encapsulation layer 150 is formed.

The intermediate layer 140 may include a rubber-like material that includes an amorphous material. The amorphous material may have a glass transition temperature that is lower than a solidus temperature of an LVT inorganic material of the thin film encapsulation layer 150 and is higher than a working temperature of the organic light emitting display apparatus 100. The amorphous material may include a polymer, such as benzyl methacrylate, tert-butyl vinyl ether, chlorotrifluoroethylene, cyclohexyl vinyl ether, N,N-dimethylacrylamide, ethylene terephthalate, ethyl methacrylate, 4-fluorostyrene, 2-hydropropyl methacrylate, hydroquinone-alt-epichlorohydrin, indene, isobornyl acrylate, N-isopropylacrylamide, isopropyl methacrylate, phenylene vinylene, phenyl vinyl ketone, trimethylsilyl methacrylate, vinyl alcohol, vinyl benzoate, vinyl chloride, vinyl cyclogexanoate, or vinyl pivalate. The intermediate layer 140, which may include an amorphous material, may be formed using, for example, one or more of a sputtering method, a co-evaporation method, a spray method, a pouring method, a painting method, a rolling method, and a spin-coating method.

The intermediate layer 140, which may include a rubber-like material, may minimize mechanical interaction between the thin film encapsulation layer 150 and the planarization layer 130. Therefore, the intermediate layer 140 may substantially prevent or minimize potential stress and/or cracks in the thin film encapsulation layer 150 that may be generated due to a substantial difference between the CTE of the planarization layer 130 and the CTE of the thin film encapsulation layer 150.

According to an embodiment, the intermediate layer 140 includes a low CTE material. For example, the intermediate layer 140 may be formed of a material having a CTE that is substantially equal to a CTE of the thin film encapsulation layer 150. In an embodiment, the intermediate layer 140 may include at least one of chromium, cobalt, aluminum oxide, gadolinium, germanium, iridium, molybdenum, nickel, niobium, platinum, titanium, vanadium, and zirconium.

The intermediate layer 140, which may include a low CTE material, may minimize mechanical interaction between the thin film encapsulation layer 150 and the planarization layer 130. Therefore, the intermediate layer 140 may substantially prevent or minimize potential stress and/or cracks in the thin film encapsulation layer 150 that may be generated due to a substantial difference between the CTE of the planarization layer 130 and the CTE of the thin film encapsulation layer 150. In an embodiment, when cooled, the low CTE material of the intermediate layer 140 may have contracting characteristics that are similar to contracting characteristics of an LVT inorganic material of the thin film encapsulation layer 150. Therefore, deformation of the thin film encapsulation layer 150 may be substantially prevented or minimized.

According to an embodiment, the intermediate layer 140 may include a mixed structure. In an embodiment, the mixed structure may include an acrylic material and a fiber member. For example, the intermediate layer 140 may include an acrylic material and an omnidirectional fiber member, and the omnidirectional fiber member may include an LVT inorganic material. The intermediate layer 140 may be formed using one or more of various methods. For example, a fiber material that includes an LVT inorganic material may be formed using a mask and/or using one or more of various methods, such as one or more of a sputtering method, a co-evaporation method, a laser ablation method, a flash deposition method, a spray method, a pouring method, a frit-deposition method, a vapor deposition method, a dip-coating method, a painting method, a rolling method, and a spin-coating method.

Subsequently, an acrylic material may be formed on the fiber member.

The intermediate layer 140 may substantially prevent or minimize potential stress and/or cracks in the thin film encapsulation layer 150 that may be generated due to a substantial difference between the CTE of the planarization layer 130 and the CTE of the thin film encapsulation layer 150. In an embodiment, when cooled, the intermediate layer 140 may have contracting characteristics that are similar to contacting characteristics of an LVT inorganic material of the thin film encapsulation layer 150. Therefore, deformation of the thin film encapsulation layer 150 may be substantially prevented or minimized.

According to an embodiment, the intermediate layer 140 may include a glass material. The glass material may include or may be an LVT inorganic material. In an embodiment, the intermediate layer 140 may have a thickness that is smaller than a thickness of the thin film encapsulation layer 150. For example, a thickness of the intermediate layer 140 may be in a range of about 10% to 80% of a thickness of the thin film encapsulation layer 150.

The intermediate layer 140 may minimize mechanical interaction between the thin film encapsulation layer 150 and the planarization layer 130. Therefore, the intermediate layer 140 may substantially prevent or minimize potential stress and/or cracks in the thin film encapsulation layer 150 that may be generated due to a substantial difference between the CTE of the planarization layer 130 and the CTE of the thin film encapsulation layer 150. In an embodiment, when cooled, the intermediate layer 140 may have contracting characteristics that are similar to contracting characteristics of an LVT inorganic material of the thin film encapsulation layer 150. Therefore, deformation of the thin film encapsulation layer 150 may be substantially prevented or minimized.

According to an embodiment, the intermediate layer 140 may include an adhesive material. The adhesive material may include or may be at least one of a UV curing material and a visible ray curing material. The intermediate layer 140 may be formed by irradiating UV and/or a visible ray on the curing material after the thin film encapsulation layer 150 is formed.

The intermediate layer 140 may substantially prevent or minimize potential stress and/or cracks in the thin film encapsulation layer 150 that may be generated due to a substantial difference between the CTE of the planarization layer 130 and the CTE of the thin film encapsulation layer 150. In an embodiment, when cooled, the intermediate layer 140 may have contracting characteristics that are similar to contacting characteristics of an LVT inorganic material of the thin film encapsulation layer 150. Therefore, deformation of the thin film encapsulation layer 150 may be substantially prevented or minimized.

The thin film encapsulation layer 150 is formed on the intermediate layer 140. The thin film encapsulation layer 150 may include at least one inorganic layer that includes an LVT inorganic material.

In a process of forming the thin film encapsulation layer 150, the LVT inorganic material may be melted and then coagulated. A Viscosity transition temperature of the thin film encapsulation layer 150 may be lower than a denaturation temperature of the organic layer 123 in the organic light emitting device 120.

In the specification, a "low-temperature viscosity transition (LVT) temperature" may refer to a minimum temperature at which the LVT inorganic material may start to change from solid to fluid, that is, a minimum temperature at which the viscosity of the LVT inorganic material starts to change. The LVT temperature may not mean a temperature at which the LVT inorganic material completely changes from a solid phase to a liquid phase.

The viscosity transition temperature of the LVT inorganic material may be lower than a denaturation temperature of a material included in the organic layer 123. In an embodiment, the viscosity transition temperature of the LVT inorganic material may be lower than a minimum among denaturation temperatures of materials included in the organic layer 123.

A denaturation temperature of the organic layer 123 may refer to a temperature at which physical and/or chemical denaturation of a material included in the organic layer 123 may start, and a plurality of denaturation temperatures may be associated with the organic layer 123 according to types and the number of materials of materials included in the organic layer 123. For example, a viscosity transition temperature of an LVT inorganic material and a denaturation temperature of an organic layer 123 may refer to a glass transition temperature Tg of the LVT inorganic material and a glass transition temperature Tg of an organic material included in the organic layer 123, respectively.

The glass transition temperatures may be measured by performing a thermogravimetric analysis (TGA) on an LVT inorganic material and by performing a TGA on an organic material included in the organic layer 123.

A glass transition temperature may be derived from a result of performing a thermal analysis that involves a TGA and a differential scanning calorimetry (DSC) in the following conditions: $N_2$ atmosphere, temperature set from a room temperature to 600° C. (10° C./min) for the TGA, temperature set from a room temperature to 400° C. for the DSC, a Pt Pan in a disposable Al Pan for the TGA, and a disposable Al pan for the DSC.

A denaturation temperature of a material included in the organic layer 123 may be greater than or equal to 130° C., but is not limited thereto. The denaturation temperature may be measured through a TGA analysis for a material included in the organic layer 123.

A minimum among denaturation temperatures of materials included in the organic layer 123 may be in a range of, for example, 130° C. to 140° C. For example, a minimum of denaturation temperatures of materials included in the organic layer 123 may be 132° C. The minimum of denaturation temperatures of materials included in the organic layer 123 may be determined first by calculating glass transition temperatures Tg through thermal analyses (e.g., according to the conditions described above) with respect to materials included in the organic layer 123 and then selecting the minimum among the glass transition temperatures Tg.

In an embodiment, a viscosity transition temperature of the LVT inorganic material may be equal to or higher than 80° C. and may be lower than 132° C. In an embodiment, a viscosity transition temperature of the LVT inorganic material may be in a range of 80° C. to 120° C. or in a range of 100° C. to 120° C. In an embodiment, a viscosity transition temperature of the LVT inorganic material may be 110° C.

The LVT inorganic material may be formed of a compound or a mixture including at least two types of compounds.

The LVT inorganic material may include a tin oxide (e.g., SnO or $SnO_2$). In an embodiment, the LVT inorganic material includes SnO that is in a range of about 20 weight % to about 100 weight % of the LVT inorganic material.

In an embodiment, the LVT inorganic material may include at least one of a phosphor oxide (e.g., $P_2O_5$), a boron phosphate ($BPO_4$), a tin fluoride (e.g., $SnF_2$), a niobium oxide (e.g., NbO), a tungsten oxide (e.g., $WO_3$), etc.

In an embodiment, the LVT inorganic material may include the following:

SnO;
SnO and $P_2O_5$;
SnO and $BPO_4$;
SnO, $SnF_2$, and $P_2O_5$;
SnO, $SnF_2$, $P_2O_5$, and NbO; or
SnO, $SnF_2$, $P_2O_5$, and $WO_3$.

In an embodiment, the LVT inorganic material may have the following composition:

1) SnO (100 wt %);
2) SnO (80 wt %) and $P_2O_5$ (20 wt %);
3) SnO (90 wt %) and $BPO_4$ (10 wt %);
4) SnO (20-50 wt %), $SnF_2$ (30-60 wt %) and $P_2O_5$ (10-30 wt %) (where a sum of weight ratios of SnO, $SnF_2$, and $P_2O_5$ is 100 wt %);
5) SnO (20-50 wt %), $SnF_2$ (30-60 wt %), $P_2O_5$ (10-30 wt %), and NbO (1-5 wt %) (where a sum of weight ratios of SnO, $SnF_2$, $P_2O_5$, and NbO is 100 wt %); or
6) SnO (20-50 wt %), $SnF_2$ (30-60 wt %), $P_2O_5$ (10-30 wt %), and $WO_3$ (1-5 wt %) (where a sum of weight ratios of SnO, $SnF_2$, $P_2O_5$, and $WO_3$ is 100 wt %).

In an embodiment, the LVT inorganic material may include SnO (42.5 wt %), $SnF_2$ (40 wt %), $P_2O_5$ (15 wt %), and $WO_3$ (2.5 wt %).

In an embodiment, the thin film encapsulation layer 150, which includes an inorganic layer having one of the above compositions, may have a viscosity transition temperature that is lower than a denaturation temperature of the organic layer 123, such that various types of defects in the thin film encapsulation layer 150 may be healed in a healing process.

According to an embodiment of the present invention, the planarization layer 130 overlaps the thin film encapsulation layer 150 and the organic light emitting device 120 to protect the organic light emitting device 120 and/or to provide a planar surface on the organic light emitting device 120.

According to an embodiment of the present invention, the intermediate layer 140 is disposed between the thin film encapsulation layer 150 and the planarization layer 130. The intermediate layer 140 may substantially prevent or minimize stresses and/or cracks in the thin film encapsulation layer 150 that may be generated due to a substantial difference between the CTE of the planarization layer 130 and the CTE of the thin film encapsulation layer 150. Advantageously, the robustness and durability of the thin film encapsulation layer 150 and the organic light emitting display apparatus 100 may be maximized.

Figure 3:
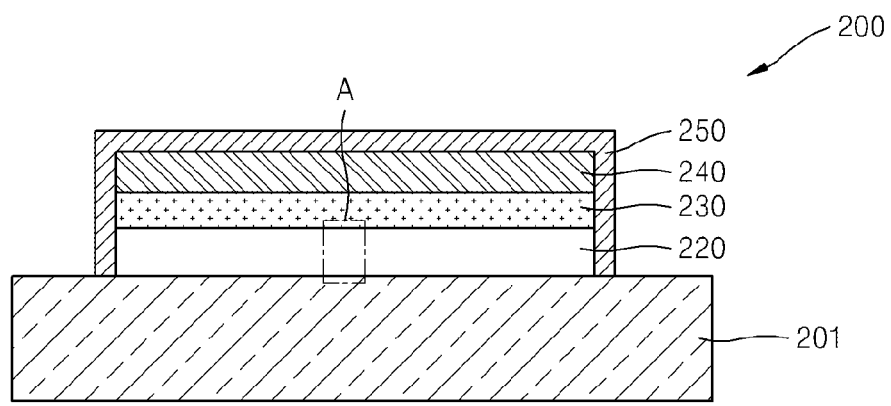
FIG. 3 is a schematic cross-sectional view illustrating an organic light emitting display apparatus according to an embodiment of the present invention.
Figure 4:
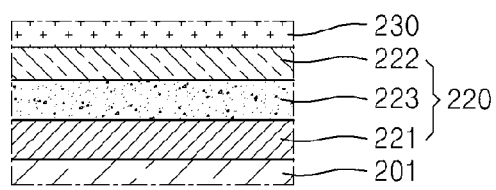
FIG. 4 is a schematic cross-sectional view illustrating a portion A indicated in FIG. 3.

FIG. 3 is a schematic cross-sectional view illustrating an organic light emitting display apparatus 200 according to an embodiment of the present invention. FIG. 4 is a schematic cross-sectional view illustrating a portion A indicated in FIG. 3. The organic light emitting display apparatus 200 may include elements and/or features that are analogous to or identical to elements and/or features of the organic light emitting display apparatus 100 discussed with reference to FIGS. 1 and 2. Referring to FIGS. 3 and 4, the organic light emitting display apparatus 200 includes a substrate 201, an organic light emitting device 220, a planarization layer 230, an intermediate layer 240, and a thin film encapsulation layer 250. The thin film encapsulation layer 250 may include at least one inorganic layer that includes a LVT inorganic material. The organic light emitting device 220 includes a first electrode 221, a second electrode 222, and an organic layer 223.

A structure of the thin film encapsulation layer 250 may be different from the thin film encapsulation layer 150 discussed with reference to FIGS. 1 and 2. The thin film encapsulation layer 250 covers the organic light emitting device 220, the planarization layer 230, and the intermediate layer 240, and contacts the substrate 201.

Figure 5:
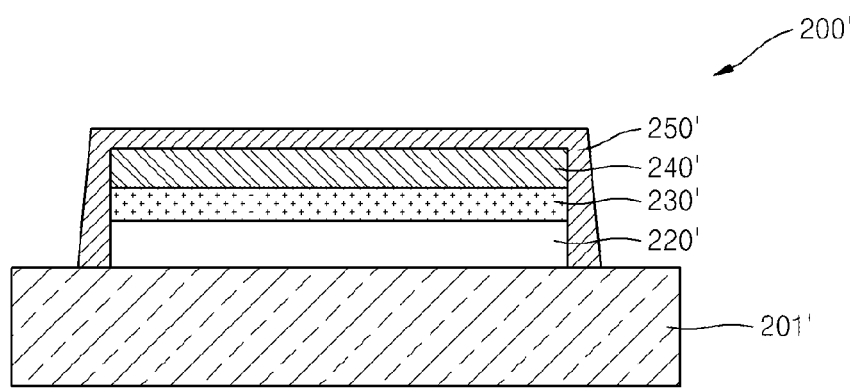
FIG. 5 is a schematic cross-sectional view illustrating an organic light emitting display apparatus according to an embodiment of the present invention.

FIG. 5 is a schematic cross-sectional view illustrating an organic light emitting display apparatus 200' according to an embodiment of the present invention. The organic light emitting display apparatus 200' may include elements and/or features that are analogous to or identical to elements and/or features of the organic light emitting display apparatus 200 discussed with reference to FIGS. 3 and 4.

Referring to FIG. 5, the organic light emitting display apparatus 200' includes a substrate 201', an organic light emitting device 220', a planarization layer 230', an intermediate layer 240', and a thin film encapsulation layer 250'. The thin film encapsulation layer 250' may include at least one inorganic layer that includes a LVT inorganic material. The organic light emitting device 220' includes a first electrode (not shown), a second electrode (not shown), and an organic layer (not shown).

A structure of the thin film encapsulation layer 250' may be different from the thin film encapsulation layer 250 discussed with reference to FIG. 3. In an embodiment, a lateral surface of the thin film encapsulation layer 250' is inclined.

In an embodiment, the thin film encapsulation layer 250' has a lateral surface that is inclined at an obtuse angle with respect to the substrate 201'. In an embodiment, the lateral surface may be inclined at an acute angle with respect to the substrate 201'.

Figure 6:
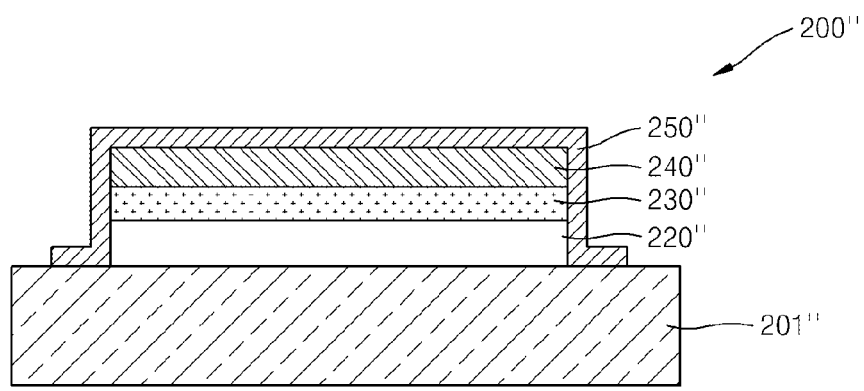
FIG. 6 is a schematic cross-sectional view illustrating an organic light emitting display apparatus according to an embodiment of the present invention.

FIG. 6 is a schematic cross-sectional view illustrating an organic light emitting display apparatus 200" according to an embodiment of the present invention. The organic light emitting display apparatus 200" may include elements and/or features that are analogous to or identical to elements and/or features of the organic light emitting display apparatus 200 discussed with reference to FIGS. 3 and 4.

Referring to FIG. 6, the organic light emitting display apparatus 200" includes a substrate 201", an organic light emitting device 220", a planarization layer 230", an intermediate layer 240", and a thin film encapsulation layer 250". The thin film encapsulation layer 250" may include at least one inorganic layer that includes a LVT inorganic material. The organic light emitting device 220" includes a first electrode (not shown), a second electrode (not shown), and an organic layer (not shown).

A structure of the thin film encapsulation layer 250" may be different from the thin film encapsulation layer 250 discussed with reference to FIG. 3. In an embodiment, a portion of the thin film encapsulation layer 250" that contacts the substrate 201" is wider than a portion of the thin film encapsulation layer 250" that does not contact the substrate 201", in order to increase a contact surface between the thin film encapsulation layer 250" and the substrate 201", so as to effectively prevent penetration of moisture, gas, or foreign substances from entering through in interface between the thin film encapsulation layer 250" and the substrate 201". The portion of the thin film encapsulation layer 250" that contacts the substrate 201" is disposed between the substrate 201" and the portion of the thin film encapsulation layer 250" that does not contact the substrate 201".

Figure 7A:
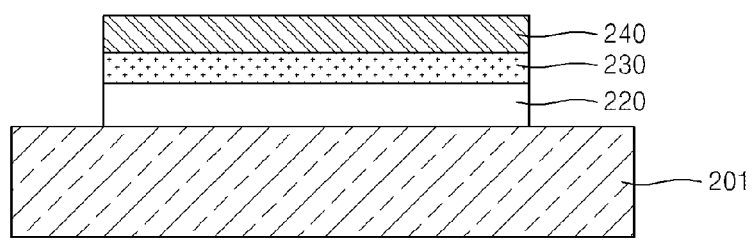
FIGS. 7A through 7C are schematic cross-sectional views sequentially illustrating a method for manufacturing an organic light emitting display apparatus according to an embodiment of the present invention.
Figure 7B:
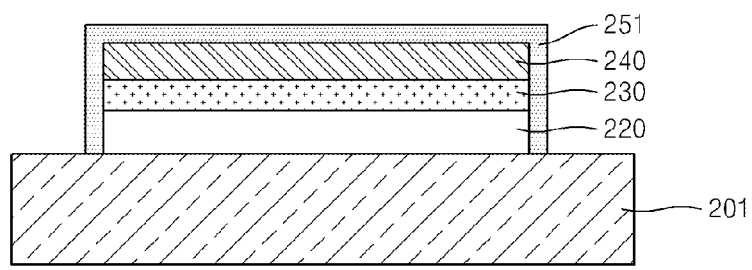
Figure 7C:
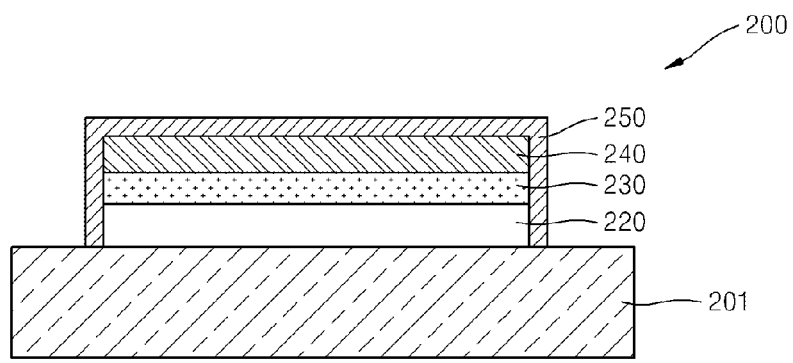

FIGS. 7A through 7C are schematic cross-sectional views sequentially illustrating a method for manufacturing an organic light emitting display apparatus 200 according to an embodiment of the present invention.

Organic light-emitting display apparatuses 100, 200', and 200" may be manufactured using substantially the same method or an analogous method.

Referring to FIG. 7A, an organic light emitting device 220, a planarization layer 230, and an intermediate layer 240 are formed on a substrate 201. The planarization layer 230 is formed of an organic material. In an embodiment, the planarization layer 230 may include an acrylic polymer material, so that planarization may be satisfactorily performed and that the planarization layer 230 may have sufficient thermal durability.

The intermediate layer 240 may be formed of one or more of various materials described above.

Subsequently, referring to FIGS. 7B and 7C, a thin film encapsulation layer 250 is formed.

Referring to FIG. 7B, a preliminary thin film encapsulation layer 251 is formed on at least the intermediate layer 240. The preliminary thin film encapsulation layer 251 may be formed of an LVT inorganic material. The preliminary thin film encapsulation layer 251 may be formed using at least one of a sputtering method, a vacuum deposition method, a low-temperature deposition method, an electron beam coating method, and an ion plating method.

According to an embodiment of the present invention, an LVT inorganic material having a composition of $SnO$—$SnF_2$—$P_2O_5$—$WO_3$ may be formed on the intermediate layer 240 in a sputtering process. In the sputtering process, dual rotary targets may be applied, the substrate 201 may be linearly moved such that LVT inorganic material is sputtered on scanned portions of the intermediate layer 240, and/or an argon plasma of 12 kw and 0.4 Pa may be used. The scanning may be performed for several times, such that the preliminary thin film encapsulation layer 251 having a desired thickness (e.g., about 1 μm) may be obtained.

Although not shown in the drawings, the preliminary thin film encapsulation layer 251 may include various defects, such as an abnormal layer-forming element, a pin hole, or an environmental element. The abnormal layer-forming element may refer to an LVT inorganic material coagulated particle that does not contribute to layer formation when the preliminary thin film encapsulation layer 251 is formed. The pin hole may be an area where no LVT inorganic material is provided. The environmental element may be a particle of an organic material or an inorganic material that is attached to the preliminary thin film encapsulation layer 251 when the organic light emitting display apparatus 200 is formed. Additionally or alternatively, a defect, such as an empty space, between the preliminary thin film layer 251 and the intermediate layer 240 may be formed.

The defects of the preliminary thin film encapsulation layer 251 described above, if not treated, might provide a path for an external environmental material, such as moisture or oxygen, to contaminate the organic light emitting device 220 and thus might cause a decrease in the lifetime of the organic light emitting display apparatus 200.

Referring to FIG. 7B and FIG. 7C, after the preliminary thin film encapsulation layer 251 has been formed, a healing operation is performed to form the thin film encapsulation layer 250.

The healing operation may be performed at a temperature higher than or equal to a viscosity transition temperature of the LVT inorganic material. In an embodiment, the healing operation may include annealing that involves heating the preliminary thin film encapsulation layer 251 at a temperature higher than or equal to the viscosity transition temperature of the LVT inorganic material and then cooling the heated preliminary thin film encapsulation layer 251 to a temperature lower than a denaturation temperature of a material of an organic layer included in the organic light emitting device 220. In an embodiment, the healing operation may include annealing that involves heating the preliminary thin film encapsulation layer 251 at a temperature higher than or equal to a viscosity transition temperature of the LVT inorganic material and then cooling the heated preliminary thin film encapsulation layer 251 to a temperature less than a minimum of denaturation temperatures of materials included in an organic layer of the organic light emitting device 220. In an embodiment, the healing operation may be performed at a viscosity transition temperature of an LVT inorganic material. In an embodiment, the healing operation may include annealing that involves heating the preliminary thin film encapsulation layer 251 in a range of 80° C. to 132° C. (e.g., in a range from 80° C. to 120° C. or in a range from 100° C. to 120° C.) and for 1-3 hours (e.g., at 110° C. for two hours). In the healing operation, fluidization of the LVT inorganic material of the preliminary thin film encapsulation layer 251 may be enabled, and denaturation of the organic light emitting device 220 may be prevented. The healing operation may be performed in an infrared (IR) oven under a vacuum atmosphere or an inactive gas atmosphere (e.g., $N_2$ atmosphere or Ar atmosphere) in order to prevent exposure of the organic light emitting device 220 to unwanted materials or particles through a pin hole of the preliminary thin film encapsulation layer 251.

In the healing operation, the LVT inorganic material included in the preliminary thin film encapsulation layer 251 may be fluidized. The fluidized LVT inorganic material may have flowability. Accordingly, in the healing operation, i) the fluidized LVT inorganic material may flow to a gap formed by the environmental element and may fill the gap, and ii) the fluidized LVT inorganic material may flow to the pin hole and may fill the pin hole, and iii) the abnormal layer-forming element may be fluidized and may fill the pin hole. The healing operation may substantially eliminate defects of the preliminary thin film encapsulation layer 251 to form a substantially robust and secure structure of the thin film encapsulation layer 250.

In an embodiment, the healing operation may be performed at least twice on the preliminary thin film encapsulation layer 251 to form the thin film encapsulation layer 250. As a result, heat resistance and mechanical intensity of the thin film encapsulation layer 250 may be optimized.

FIGS. 8A through 8E are schematic views sequentially illustrating a method for manufacturing an organic light emitting display apparatus 200 according to an embodiment of the present invention.

Organic light-emitting display apparatuses 100, 200', and 200" may be manufactured using substantially the same method or an analogous method.

Figure 8A:
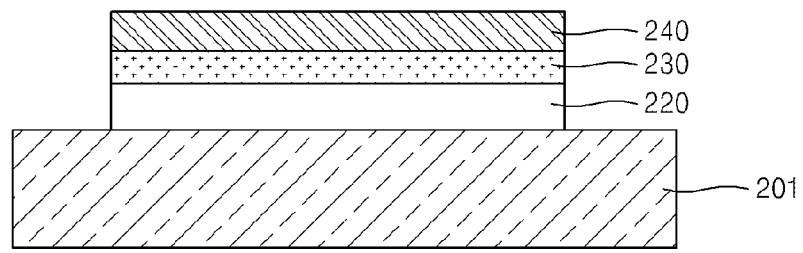
FIGS. 8A through 8E are schematic views sequentially illustrating a method for manufacturing an organic light emitting display apparatus according to an embodiment of the present invention.

Referring to FIG. 8A, an organic light emitting device 220, a planarization layer 230, and an intermediate layer 240 are formed on a substrate 201. The planarization layer 230 is formed of an organic material. In an embodiment, the planarization layer 230 may include an acrylic polymer material, so that planarization may be satisfactorily performed and that the planarization layer 230 may have sufficient thermal durability.

The intermediate layer 240 may be formed of one or more of various materials. In an embodiment of the present invention, the intermediate layer 240 may have a mixed structure that includes an acrylic material member and a fiber member. In an embodiment, the intermediate layer 240 includes an acrylic material member and an omnidirectional fiber member, wherein the omnidirectional fiber member may include an LVT inorganic material.

Figure 8B:
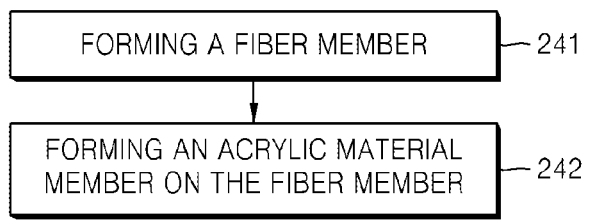
Figure 8C:
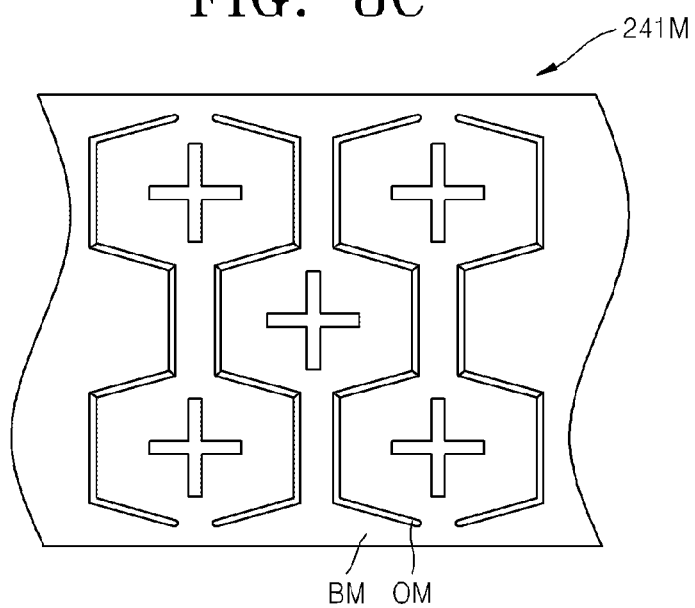

FIG. 8B is a flowchart illustrating a method for forming the intermediate layer 240. The method may include a first operation 241 and a second operation 242. In the first operation 241, a fiber member that includes an LVT inorganic material is formed. The first operation 241 may include using a mask 241M illustrated in FIG. 8C. The mask 241M includes a main body portion BM and an opening portion OM. The opening portion OM of the mask 241M may have a multidirectional pattern (e.g., a substantially omnidirectional pattern) instead of a unidirectional pattern or a pattern in a predetermined direction. An LVT inorganic material is provided on the planarization layer 230 as according to the pattern of the opening portion OM and in substantially the same shape as the opening portion OM to form the fiber member. The LVT inorganic material may be provided on the planarization layer 230 using one or more of a sputtering method, a co-evaporation method, a laser ablation method, a flash deposition method, a spray method, a pouring method, a frit-deposition method, a vapor deposition method, a dip-coating method, a painting method, a rolling method, and a spin-coating method.

Subsequently, in the second operation 242, an acrylic material may be provided on the fiber member to form the acrylic material member, so as to complete the intermediate layer 240.

Figure 8D:
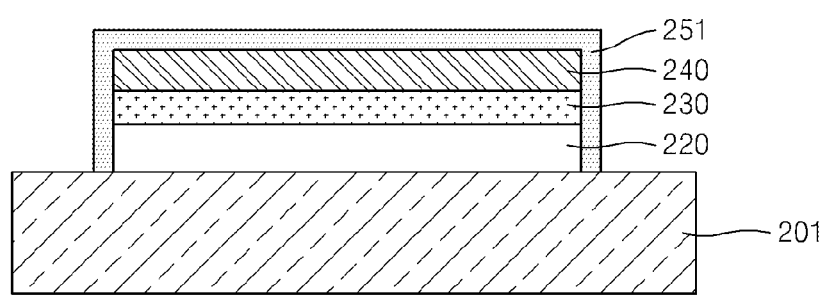
Figure 8E:
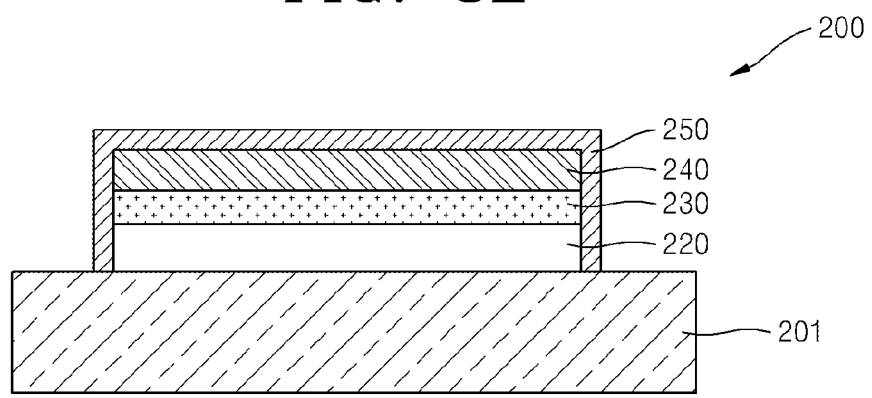

Subsequently, referring to FIG. 8D and FIG. 8E, the preliminary thin film encapsulation layer 251 is formed, and then a healing operation is performed on the preliminary thin film encapsulation layer 251 to form the thin film encapsulation layer 250. Operations of forming the preliminary thin film encapsulation layer 251 and the thin film encapsulation layer 250 may be substantially identical to or analogous to those described with reference to FIG. 7B and FIG. 7C.

According to embodiments of the invention, satisfactory encapsulation characteristics and durability of an organic light emitting display apparatus may be achieved.

While the present invention has been particularly shown and described with reference to illustrative embodiments, ordinary skill in the art would understand that various changes in form and details may be made therein without departing from the spirit and scope of the present invention as defined by the following claims.

What is claimed is:

1. An organic light emitting display apparatus comprising:
a substrate;
an organic light emitting device that overlaps the substrate and includes a first electrode, a second electrode, and an organic layer including at least an organic emission layer;
a planarization layer that overlaps the organic light emitting device and includes an organic material, wherein the organic light emitting device is disposed between the substrate and the planarization layer;
an encapsulation layer that overlaps the planarization layer and includes at least one inorganic layer including a low temperature viscosity transition (LVT) inorganic material, wherein the planarization layer is disposed between the organic light emitting device and a portion of the encapsulation layer; and
an intermediate layer that is disposed between the planarization layer and the portion of the encapsulation layer, wherein a thermal expansion coefficient of the intermediate layer is between a thermal expansion coefficient of the encapsulation layer and a thermal expansion coefficient of the planarization layer.

2. An organic light emitting display apparatus comprising:
a substrate;
an organic light emitting device that overlaps the substrate and includes a first electrode, a second electrode, and an organic layer including at least an organic emission layer;
a planarization layer that overlaps the organic light emitting device and includes an organic material, wherein the organic light emitting device is disposed between the substrate and the planarization layer;
an encapsulation layer that overlaps the planarization layer and includes at least one inorganic layer including a low temperature viscosity transition (LVT) inorganic material, wherein the planarization layer is disposed between the organic light emitting device and a portion of the encapsulation layer; and
an intermediate layer that is disposed between the planarization layer and the portion of the encapsulation layer, wherein the intermediate layer includes an amorphous material or a crystalline material that has a low viscosity or non-sticking properties.

3. The organic light emitting display apparatus of claim 2, wherein the amorphous material and the crystalline material has a glass transition temperature that is higher than a glass transition temperature Tg of the LVT inorganic material of the encapsulation layer.

4. An organic light emitting display apparatus comprising:
a substrate;

an organic light emitting device that overlaps the substrate and includes a first electrode, a second electrode, and an organic layer including at least an organic emission layer;

a planarization layer that overlaps the organic light emitting device and includes an organic material, wherein the organic light emitting device is disposed between the substrate and the planarization layer;

an encapsulation layer that overlaps the planarization layer and includes at least one inorganic layer including a low temperature viscosity transition (LVT) inorganic material, wherein the planarization layer is disposed between the organic light emitting device and a portion of the encapsulation layer; and an intermediate layer that is disposed between the planarization layer and the portion of the encapsulation layer, wherein the intermediate layer includes a low-melting point material.

5. The organic light emitting display apparatus of claim 4, wherein the low-melting point material includes an amorphous material or a crystalline material that has a lower melting temperature than a liquidization temperature of the LVT inorganic material of the encapsulation layer.

6. An organic light emitting display apparatus comprising:
a substrate;
an organic light emitting device that overlaps the substrate and includes a first electrode, a second electrode, and an organic layer including at least an organic emission layer;
a planarization layer that overlaps the organic light emitting device and includes an organic material, wherein the organic light emitting device is disposed between the substrate and the planarization layer;
an encapsulation layer that overlaps the planarization layer and includes at least one inorganic layer including a low temperature viscosity transition (LVT) inorganic material, wherein the planarization layer is disposed between the organic light emitting device and a portion of the encapsulation layer; and
an intermediate layer that is disposed between the planarization layer and the portion of the encapsulation layer, wherein the intermediate layer includes an elastic material with a modulus of elasticity lower than 2.5 GPa.

7. An organic light emitting display apparatus comprising:
a substrate;
an organic light emitting device that overlaps the substrate and includes a first electrode, a second electrode, and an organic layer including at least an organic emission layer;
a planarization layer that overlaps the organic light emitting device and includes an organic material, wherein the organic light emitting device is disposed between the substrate and the planarization layer;
an encapsulation layer that overlaps the planarization layer and includes at least one inorganic layer including a low temperature viscosity transition (LVT) inorganic material, wherein the planarization layer is disposed between the organic light emitting device and a portion of the encapsulation layer; and
an intermediate layer that is disposed between the planarization layer and the portion of the encapsulation layer, wherein the intermediate layer includes an amorphous material that has a glass transition temperature that is lower than a solidus temperature of the LVT inorganic material of the encapsulation layer and is higher than a working temperature of the organic light emitting display apparatus.

8. An organic light emitting display apparatus comprising:
a substrate;
an organic light emitting device that overlaps the substrate and includes a first electrode, a second electrode, and an organic layer including at least an organic emission layer;
a planarization layer that overlaps the organic light emitting device and includes an organic material, wherein the organic light emitting device is disposed between the substrate and the planarization layer;
an encapsulation layer that overlaps the planarization layer and includes at least one inorganic layer including a low temperature viscosity transition (LVT) inorganic material, wherein the planarization layer is disposed between the organic light emitting device and a portion of the encapsulation layer; and
an intermediate layer that is disposed between the planarization layer and the portion of the encapsulation layer, wherein the intermediate layer includes a material having a low coefficient of thermal expansion.

9. The organic light emitting display apparatus of claim 8, wherein the material having a low coefficient of thermal expansion comprises chromium, cobalt, an aluminum oxide, gadolinium, germanium, iridium, molybdenum, nickel, niobium, platinum, titanium, vanadium or zirconium.

10. An organic light emitting display apparatus comprising:
a substrate;
an organic light emitting device that overlaps the substrate and includes a first electrode, a second electrode, and an organic layer including at least an organic emission layer;
a planarization layer that overlaps the organic light emitting device and includes an organic material, wherein the organic light emitting device is disposed between the substrate and the planarization layer;
an encapsulation layer that overlaps the planarization layer and includes at least one inorganic layer including a low temperature viscosity transition (LVT) inorganic material, wherein the planarization layer is disposed between the organic light emitting device and a portion of the encapsulation layer; and
an intermediate layer that is disposed between the planarization layer and the portion of the encapsulation layer, wherein the intermediate layer includes an acrylic material member and a fiber member that overlap each other.

11. The organic light emitting display apparatus of claim 10, wherein the fiber member includes a multidirectional fiber formed of a low temperature viscosity transition (LVT) inorganic material.

12. An organic light emitting display apparatus comprising:
a substrate;
an organic light emitting device that overlaps the substrate and includes a first electrode, a second electrode, and an organic layer including at least an organic emission layer;
a planarization layer that overlaps the organic light emitting device and includes an organic material, wherein the organic light emitting device is disposed between the substrate and the planarization layer;
an encapsulation layer that overlaps the planarization layer and includes at least one inorganic layer including a low temperature viscosity transition (LVT) inorganic material, wherein the planarization layer is disposed between the organic light emitting device and a portion of the encapsulation layer; and an intermediate layer that is disposed between the planarization layer and the portion of the encapsulation layer, wherein the intermediate layer includes a glass material containing an LVT inorganic material, and is thinner than the encapsulation layer.

13. The organic light emitting display apparatus of claim 1, wherein the intermediate layer includes an adhesive material.

14. The organic light emitting display apparatus of claim 1, wherein a viscosity transition temperature of the LVT inorganic material is a minimum temperature at which flowability is provided to the LVT inorganic material.

15. The organic light emitting display apparatus of claim 1, wherein a viscosity transition temperature of the LVT inorganic material is lower than a denaturalization temperature of materials included in an organic layer of the organic light emitting device.

16. The organic light emitting display apparatus of claim 1, wherein the LVT inorganic material includes a tin oxide.

17. The organic light emitting display apparatus of claim 1, wherein the LVT inorganic material further includes at least one of a phosphor oxide, a boron phosphate, a tin fluoride, a niobium oxide, and a tungsten oxide.

18. The organic light emitting display apparatus of claim 1, wherein the LVT inorganic material of the encapsulation layer includes SnO; SnO and $P_2O_5$; SnO and $BPO_4$; SnO, $SnF_2$, and $P_2O_5$; SnO, $SnF_2$, $P_2O_5$, and NbO; or SnO, $SnF_2$, $P_2O_5$, and $WO_3$.

\* \* \* \* \*